United States Patent [19]

Soclof et al.

[11] 4,361,814
[45] Nov. 30, 1982

[54] DISTRIBUTED OPTICAL PARAMETRIC AMPLIFIER

[75] Inventors: Sidney I. Soclof, San Gabriel; Michael T. Elliott, Carbon Canyon, both of Calif.

[73] Assignee: Rockwell International Corporation, El Segundo, Calif.

[21] Appl. No.: 191,545

[22] Filed: Sep. 29, 1980

[51] Int. Cl.$^3$ .......................... H01S 4/00; H03F 3/10; H03F 7/04
[52] U.S. Cl. .......................................... 330/4.9; 357/4; 357/57; 307/424
[58] Field of Search .................. 330/4.3, 4.9; 307/430, 307/424, 312; 357/4, 24, 57

[56] References Cited

U.S. PATENT DOCUMENTS

| | | | |
|---|---|---|---|
| 2,884,607 | 4/1959 | Uhlin | 357/90 |
| 2,980,810 | 4/1961 | Goldey | 357/57 |
| 3,356,866 | 12/1967 | Misawa | 357/58 |
| 3,772,528 | 11/1973 | Anderson | 330/4.9 |
| 3,938,172 | 2/1976 | Lockwood | 357/17 |
| 3,982,270 | 9/1976 | Cline et al. | 357/14 |
| 4,103,312 | 7/1978 | Chang et al. | 357/4 |
| 4,131,858 | 12/1978 | Nieherhe et al. | 330/4.9 |
| 4,205,331 | 5/1980 | Esaki et al. | 357/4 |
| 4,208,667 | 6/1980 | Chang et al. | 357/4 |
| 4,261,771 | 4/1981 | Dingle et al. | 357/4 |
| 4,297,718 | 10/1981 | Nishizawa et al. | 357/22 |

Primary Examiner—Nelson Moskowitz
Attorney, Agent, or Firm—H. Fredrick Hamann; Daniel R. McGlynn

[57] ABSTRACT

A parametric amplifier including a semiconductor body portion (10) comprising a plurality of zones (11,13,15, ...) of a first conductivity type, each of the zones having a thickness less than or equal to the Debye length in the semiconductor body portion (11,13,15, ...), each of the zones being separated from one another by corresponding insulating layers (12,14, ...). The body portion has a first edge portion abutting a first edge of the plurality of zones, and a second edge portion abutting a second edge of the plurality of zones spaced apart from said first edge.

A first interface (20) is provided adjacent the first edge portion for transmitting an electromagnetic wave into the semiconductor body portion for propagation therein; and a second interface (21) is provided adjacent the second edge portion for receiving an electromagnetic wave propagating in the body portion.

5 Claims, 2 Drawing Figures

DISTRIBUTED OPTICAL PARAMETRIC AMPLIFIER

FIELD OF THE INVENTION

The invention relates to parametric amplifiers, and particularly a parametric amplifier constructed as semiconductor devices comprising a succession of semiconductor zones.

BACKGROUND OF THE INVENTION

Various types of parametric amplifiers constructed as semiconductor devices with successions of zones of semiconductor material are known in the prior art. For example, U.S. Pat. No. 2,884,607 describes a semiconductor non-linear capacitance diode in which a single crystal semiconductor body is composed of regions of alternate p and n-type conductivity with the impurity concentration which in each zone is arranged so that the concentration gradient adjacent to successive junctions is alternately gradual and abrupt. The device is able to function as a parametric amplifier and also permits a high cutoff frequency as a result of the extremely close spacing of the junctions within the diode.

Similar structures are also found in U.S. Pat. Nos. 2,980,810, 3,938,172 and 3,982,270.

An alternative configuration of devices formed of successive layers of semiconductor material and intermediate insulating layers are found in U.S. Pat. Nos. 3,356,866, and 3,822,533.

SUMMARY OF THE INVENTION

Briefly, and in general terms, the invention provides a semiconductor structure comprising a succession of zones of a first conductivity type, each of the zones having a thickness less than or equal to the Debye length in the semiconductor body, the alternating layers separated by thin insulating layers.

There are a number of different methods of operating the present invention. A bias voltage may be applied across the entire stack, or alternatively to alternate layers. In another configuration the semiconductor structure is formed as a mesa type structure on top of a substrate. A waveguide for an electromagnetic wave of either microwave or optical frequency is applied to opposed ends of the measured structure so that the structure operates as an amplifier or a modulator/demodulator for an incoming electromagnetic wave.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

DESCRIPTION OF THE PREFERRED EMBODIMENTS

Figure 1:
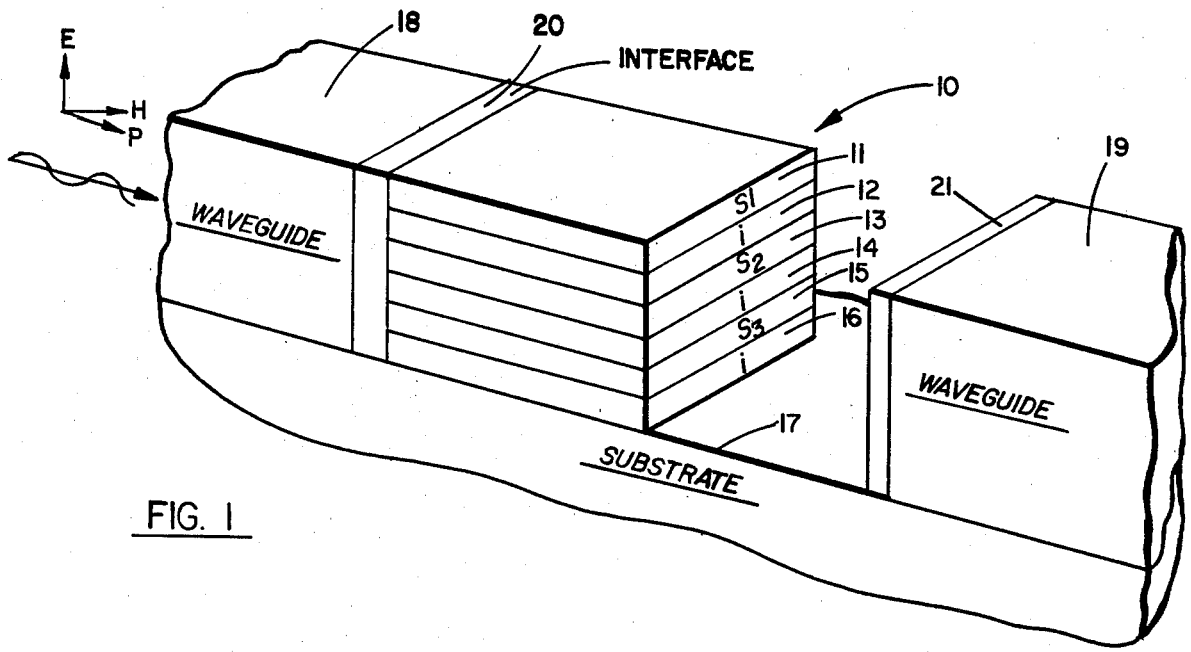
FIG. 1 is a perspective view of an embodiment of the present invention showing a cross-section as implemented on a substrate.

FIG. 1 shows a perspective view of an embodiment of the present invention including a cutout to show the uniform layered structure. The invention basically consists of a semiconductor structure 10 disposed on a substrate 17. Whether the substrate 17 is composed of the same semiconductor material as the semiconductor structure 10, or an insulating material is not pertinent to the present invention. The semiconductor body 10 is composed of a succession of zones 11, 12, 13, 14, 15, and 16. In the embodiment of the present invention shown in FIG. 1 the zones consist of a sequence of alternating semiconductor and insulating layers. In the embodiment, according to the present invention, each of these zones has a thickness less than or equal to the Debye length in the semiconductor body.

The semiconductor structure 10 operates as a distributed optical parametric amplifier when a electromagnetic wave of suitable microwave or optical frequency is applied thereto. One method of interfacing the semiconductor structure 10 with a propagating electromagnetic wave is to interface the semiconductor structure with a waveguide in which such waveguide is propagating. A waveguide 18 may be provided which is disposed on the surface of the substrate 17 which interfaces with the semiconductor structure 10 at an interface region 20. The interface region 20 is transparent to the electromagnetic wave and non-dispersive so that a wave propagating in the waveguide 18 is coupled to the semiconductor structure 10 so that the wave continues propagation into the semiconductor structure 10 and ultimately into a second wavegide 19. For example, if the guiding structure is an optical fiber, interface region 20 would be of an optically transparent medium of suitable index of refraction and of suitable geometric configuration to provide for a maximum transmission of the EM wave into the semiconductor body with a minimum of reflective and transmissive losses.

There are a number of different methods of operating the semiconductor structure. In one case a bias voltage may be applied across the entire stack, that is a bias voltage applied to the top layer 11 and to the substrate 17. An alternative approach would be to apply the bias layer alternately to alternate layers, that is a first potential applied to layers $S_1$ and $S_3$ and a second potential applied to $S_2$.

It is important to understand how the semiconductor structure 10 operates as a parametric amplifier, and in particular a distributed parametric amplifier.

Conventional parametric amplifiers (p-n junctions) known in the prior art operate by modulating the capacitance of the structure.

The present invention provides a distributed parametric amplifier which allows a higher frequency of operation than is possible with a lumped amplifier. Basically for a lumped element, $$i = \frac{d}{dt}(CV) \text{ and if } C = C_o + C_1 V + \ldots$$

and $V = V_s \cos \omega_s t + V_p \cos \omega_p t$. This gives rise to three effects, a linear term, a doubling term, and a non-linear term. This last term is seen to be, $$\frac{i_{\omega_p \pm \omega_s}}{i_{\omega_s}} \simeq \left(\frac{\omega_p}{\omega_s} \pm 1\right) \frac{C_1 V_p}{C_o},$$

whereupon for correct values of $C_1$, $V_p$, and $C_o$, gain can take place at $\omega_p \pm \omega_s$ (from energy supplied at $\omega_p$). For the distributed element, the same situation holds for $$J = \frac{dD}{dt} = \frac{d}{dt}(\epsilon E)$$

where $\epsilon = \epsilon_0 + \epsilon_1 E$ and $E = E_s \cos \omega_s t + E_p \cos \omega_p t$, from which one has:

$$\frac{J_{\omega_p \pm \omega_s}}{J_{\omega_s}} \simeq \frac{\omega_p}{\omega_s} \pm 1 \frac{\epsilon_1 E_p}{\epsilon_0}$$

By reducing the dimensions d, and fabricating a multiple structured parameteric amplifier, the frequency of operation can be made even higher, as is provided by the present invention.

In prior art composite devices, the dimension d of a typical layer is $>> L_D$, the Debye length. The Debye length is the distance in a material beyond which the electric field of a charged particle is shielded by particles having opposite charges, and is of the order of 1000 Angstroms. However, as this dimension is further reduced, a state is reached at which the fields totally deplete the layers and the device response staturates. The stack may be fabricated as a composite structure shown in FIG. 1 composed of semiconductor/insulator layers.

Such a layered structure can be called a "classical" superlattice and is characterized by dimension $d \leq L_D$ and wavelengths $\lambda \leq 1$ mm (reaching into the "optical" regions of the electromagnetic spectrum). The basic idea is that the net carrier distribution is governed by the Boltzmann factor $\exp[V(x)/V_T]$ which is a non-linear function of the voltage, $V(x)$.

Figure 2A:
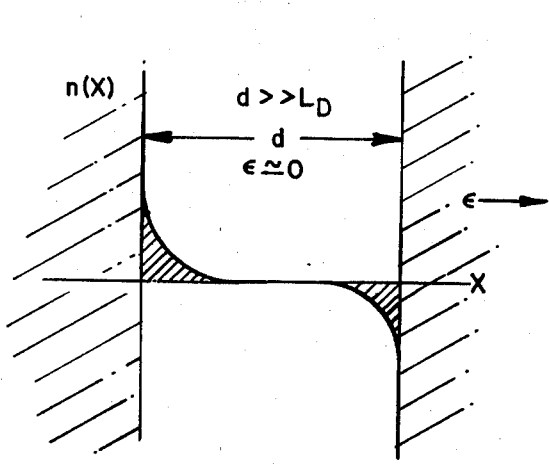
FIG. 2a is a plot of electron distribution in the direction shown by the arrows in FIG. 1 through one of the layers of the semiconductor structure when the thickness of the layer is greater than the Debye length.
Figure 2B:
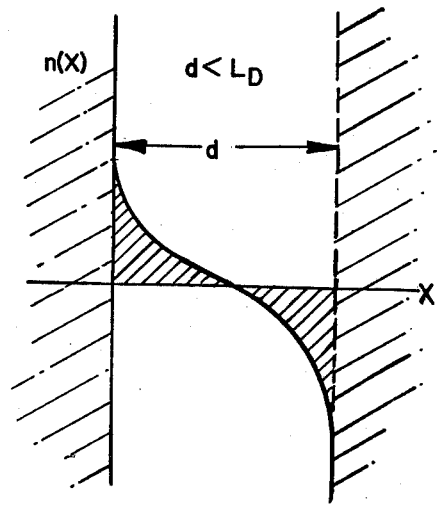
FIG. 2b is the same as 2a in which the thickness of the semiconductor layer is less than or equal to the Debye length.

For a semiconductor layer of thickness d, where d is large compared to the Debye length, the non-linear dependence of the free-carrier distribution on the voltage (and hence the electric field is not important since this distribution just extends over a distance of approximately $L_D$, as illustrated in FIG. 2a. However, for layers of thickness $d \leq L_D$ the carrier distribution becomes very important in determining the average internal field in the structure V, as shown in FIG. 2b.

The free carrier distribution in the layer will be a non-linear function of the electric field and, consequently, the net electric flux of the structure will be also non-linear. In particular, a strong electric field (EM wave) can influence the propagation characteristics of a weaker EM wave.

If the layer thicknesses are reduced even further, such that $d << L_D$ and d < mean free path of electronic carriers, the realm of the quantum superlattice is reached. In this case, since the dimensions are small compared to the Debye length, the free carrier distribution is not important, and the interaction of the individual carriers with the electric field becomes significant. The non-linear behavior then derives from the non-linear behavior of the free carrier transport characteristics, especially as it relates to the modified band structure (i.e., the E vs k curve and the "minizones"). Part of this non-linear behavior is a result of the tunneling process that becomes possible as the insulator layer thickness becomes less than 100Å.

It will be obvious to those skilled in the art that the semiconductor structure according to the present invention can be implemented with various semiconductor technologies and different combinations of known process steps, and that the preferred embodiments illustrated here are merely exemplary. The depth of penetration of the various zones and regions and in particular the configuration and distance between the active zones of the device, as well as the concentrations of dopant species, and/or their concentration profiles, can be chosen depending upon the desired properties. These and other variations can be further elaborated by those skilled in the art without departing from the scope of the present invention.

The present invention is moreover not restricted to the particular embodiments described. For example, it may be pointed out that semiconductor materials other than silicon, for example $A_{III}$-$B_V$ compounds may be used.

Without further analysis, the foregoing will so fully reveal the gist of the present invention that others can, by applying current knowledge, readily adapt it for various applications without omitting features that, from the standpoint of prior art, fairly constitutes essential characteristics of the generic or specific aspects of this invention, and, therefore, such adaptations should and are intended to be comprehended within the meaning and range of equivalence of the following claims.

We claim:

1. A microwave parametric amplifier comprising:
   a semiconductor body portion comprising a plurality of zones of a first conductivity type, each of said zones having a thickness less than or equal to the Debye length in the semiconductor body portion, each of said zones being separated from one another by an insulating layer, said body portion having a first face portion abutting a first edge of said plurality of zones, and a second face portion abutting a second edge of said plurality of zones spaced apart from said first face portion;
   first interface means adjacent said first face portion for transmitting an electromagnetic wave of microwave frequency into said semiconductor body portion for propagation therein; and
   second interface means adjacent said second face portion for receiving an electromagnetic wave of microwave frequency propagating in said body portion.

2. An amplifier as defined in claim 1, further comprising means for applying an electrical potential to alternate zones of said semiconductor body portion.

3. An amplifier as defined in claim 1, further comprising means for applying an electrical potential across two diametrically opposed faces of said semiconductor body portion, said diametrically opposed faces being different from said first face portion and said second face portion.

4. An amplifier as defined in claim 1, further comprising means for applying an electrical potential to alternate zones of said semiconductor body portion.

5. An amplifier as defined in claim 1, further comprising means for applying an electrical potential across two diametrically opposed faces of said semiconductor body portion, said diametrically opposed faces being different from said first face portion and said second face portion.

* * * * *